United States Patent
Kakizaki et al.

(10) Patent No.: US 10,829,604 B2
(45) Date of Patent: Nov. 10, 2020

(54) GLASS CLOTH, PREPREG AND PRINTED WIRING BOARD

(71) Applicant: ASAHI KASEI KABUSHIKI KAISHA, Tokyo (JP)

(72) Inventors: Hirotaka Kakizaki, Tokyo (JP);
Masaharu Sugimura, Tokyo (JP);
Shinichiro Tachibana, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 99 days.

(21) Appl. No.: 16/175,227

(22) Filed: Oct. 30, 2018

(65) Prior Publication Data

US 2019/0136000 A1  May 9, 2019

(30) Foreign Application Priority Data

Oct. 31, 2017 (JP) ................. 2017-210984

(51) Int. Cl.

| | |
|---|---|
| *C08J 5/24* | (2006.01) |
| *C03C 13/00* | (2006.01) |
| *D03D 15/00* | (2006.01) |
| *D06M 11/78* | (2006.01) |
| *H05K 1/03* | (2006.01) |
| *C08J 5/04* | (2006.01) |
| *C03C 3/097* | (2006.01) |
| *C03C 25/40* | (2006.01) |
| *C03C 25/1095* | (2018.01) |
| *D06M 101/00* | (2006.01) |
| *B32B 15/14* | (2006.01) |
| *B32B 5/26* | (2006.01) |

(52) U.S. Cl.
CPC ............ *C08J 5/24* (2013.01); *C03C 3/097* (2013.01); *C03C 13/00* (2013.01); *C03C 25/1095* (2013.01); *C03C 25/40* (2013.01); *C08J 5/043* (2013.01); *D03D 15/0011* (2013.01); *D06M 11/78* (2013.01); *H05K 1/0306* (2013.01); *B32B 5/26* (2013.01); *B32B 15/14* (2013.01); *C03C 2213/00* (2013.01); *C08J 2363/00* (2013.01); *C08J 2363/02* (2013.01); *C08J 2463/00* (2013.01); *C08J 2463/04* (2013.01); *D06M 2101/00* (2013.01); *D10B 2101/06* (2013.01); *H05K 2201/029* (2013.01)

(58) Field of Classification Search
CPC ...... C08J 5/24; C08J 2363/00; C08J 2463/00; C03C 13/00; C03C 2213/00; D03D 15/0011; D06M 11/78; D06M 2101/00; D10B 2101/06; H05K 1/0306
USPC ........................................... 524/492
See application file for complete search history.

(56) References Cited

U.S. PATENT DOCUMENTS

| | | | | |
|---|---|---|---|---|
| 5,236,777 A | * | 8/1993 | Inoguchi | ............... C03C 25/26 442/60 |
| 5,952,254 A | * | 9/1999 | De Meringo | ........... C03C 13/00 428/374 |
| 2004/0175557 A1 | * | 9/2004 | Creux | ..................... C03C 3/118 428/299.7 |
| 2018/0094110 A1 | | 4/2018 | Nakanishi et al. | |

FOREIGN PATENT DOCUMENTS

WO    WO 2016/175248 A1    11/2016

* cited by examiner

*Primary Examiner* — Hui H Chin
(74) *Attorney, Agent, or Firm* — Birch, Stewart, Kolasch & Birch, LLP

(57) ABSTRACT

A glass cloth comprising a glass yarn woven together, the glass yarn comprising multiple glass filaments, wherein an amount of $B_2O_3$ in a composition of the glass filaments is 15% by mass to 30% by mass, an amount of $SiO_2$ in the composition thereof is 45% by mass to 60% by mass, and an amount of $P_2O_5$ in the composition thereof is 2% by mass to 8% by mass, and loss on ignition (LOI) of the glass cloth is 0.90% by mass to 2.0% by mass.

6 Claims, No Drawings

GLASS CLOTH, PREPREG AND PRINTED WIRING BOARD

TECHNICAL FIELD

The present invention relates to a glass cloth, a prepreg and a printed wiring board.

BACKGROUND ART

Currently, as information terminals such as smartphones have become increasingly sophisticated and capable of high-speed communication, printed wiring boards to be used in such information terminals have come to have significantly low dielectric constant and dielectric tangent.

An insulating material widely used for such printed wiring boards is a laminate formed by stacking prepregs each obtained through impregnation of a glass cloth with a thermosetting resin (hereinafter, referred to as "matrix resin") such as an epoxy resin and by causing the prepregs to undergo curing under heat and pressure. While the dielectric constant of a matrix resin for use in substrates for high-speed communication applications is about 3, the dielectric constant of a common E glass cloth is about 6.7, and the high dielectric constant of the resulting laminate has emerged as a problem.

Thus, there have been proposed low-dielectric constant-glass cloths based on glasses such as D glass, NE glass, and L glass which are different in composition from E glass. Reduction in dielectric constant generally requires increasing the proportions of $SiO_2$ and $B_2O_3$ in the composition of glass.

An increase in the proportion of $B_2O_3$ provides a decrease in glass melt viscosity, which makes production of glass yarns easy. The decrease in glass melt viscosity leads to a decrease in the amount of bubbles (hereinafter, referred to as "hollow filaments") formed in glass filament during drawing of the glass yarns. Such hollow filaments are a key quality factor highly responsible for deterioration in the insulation reliability of a substrate.

Increasing the proportion of $B_2O_3$ unfortunately entails an increase in the amount of moisture absorption of glass. The amount of moisture absorption of glass is a factor that is very highly responsible for deterioration in the insulation reliability of a substrate. Despite the decrease in the amount of hollow filaments, the increase in the amount of moisture absorption of glass causes a significant deteriorating effect on the insulation reliability of a substrate. To address this problem, a method has been proposed in which a surface treatment agent is attached to the surface of a glass cloth in an amount of 0.25% or more (see Patent Document 1, for example).

CITATION LIST

Patent Document

[Patent Document 1] International Publication No. WO2016/175248

SUMMARY OF INVENTION

Technical Problem

However, there is still a demand that substrates, resins, and glass cloths should have a further lowered dielectric constant in order, for example, to establish the next-generation 5G communication technology. It is also necessary, when lowering the dielectric constant of a resin and glass cloth, to ameliorate the corresponding reduction in adhesion and insulation reliability.

The present invention has been made in view of the above problems, and an object of the present invention is to provide a glass cloth having a low dielectric constant and high insulation reliability.

Solution to Problem

As a result of investigations aimed at solving the above problems, the present inventors have found that a glass cloth can have a low dielectric constant and high insulation reliability when glass filaments constituting the glass cloth have predetermined amounts of $B_2O_3$, $SiO_2$, and $P_2O_5$ in the composition thereof and the loss on ignition (LOI) of the glass cloth is within a predetermined range. Based on this finding, the inventors have completed the present invention.

That is, the present invention is as follows.

[1]

A glass cloth comprising a glass yarn woven together, the glass yarn comprising multiple of glass filaments, wherein
an amount of $B_2O_3$ in a composition of the glass filaments is 15% by mass to 30% by mass, an amount of $SiO_2$ in a composition thereof is 45% by mass to 60% by mass, and an amount of $P_2O_5$ a composition thereof is 2% by mass to 8% by mass, and loss on ignition (LOI) of the glass cloth is 0.90% by mass to 2.0% by mass.

[2]

The glass cloth according to [1], being surface-treated with a silane coupling agent represented by the following formula (1):

$$X(R)_{3-n}SiY_n \qquad (1),$$

wherein X is an organic functional group having one or more of at least either of an amino group and an unsaturated double bond group, each Y is independently an alkoxy group, n is an integer of 1 to 3, and each R is independently a group selected from the group consisting of a methyl group, an ethyl group, and a phenyl group.

[3]

The glass cloth according to [1], being surface-treated with a silane coupling agent represented by the following formula (2):

$$X(R)_{3-n}SiY_n \qquad (2),$$

wherein X is an organic functional group having three or more of at least either of an amino group and an unsaturated double bond group, each Y is independently an alkoxy group, n is an integer of 1 to 3, and each R is independently a group selected from the group consisting of a methyl group, an ethyl group, and a phenyl group.

[4]

The glass cloth according to [1], being surface-treated with a silane coupling agent represented by the following formula (3):

$$X(R)_{3-n}SiY_n \qquad (3),$$

wherein X is an organic functional group having four or more of at least either of an amino group and an unsaturated double bond group, each Y is independently an alkoxy group, n is an integer of 1 to 3, and each R is independently a group selected from the group consisting of a methyl group, an ethyl group, and a phenyl group.

[5]

A prepreg comprising the glass cloth according to any one of [1] to [4] and a matrix resin impregnating the glass cloth.

[6]

A printed wiring board produced using the prepreg according to [5].

Advantageous Effect of Invention

The use of the glass cloth of the present invention allows production of a prepreg and printed wiring board having a low dielectric constant and high insulation reliability.

DESCRIPTION OF EMBODIMENTS

An embodiment of the present invention (hereinafter, referred to as "the present embodiment") will now be described in detail, but the present invention is not limited thereto and can be variously modified within the scope not departing from the gist of the present invention.

[Glass Cloth]

A glass cloth of the present embodiment is a glass cloth comprising a glass yarn woven together, the glass yarn comprising multiple glass filaments.

The amount of $B_2O_3$ in the composition of the glass filaments is 15% by mass to 30% by mass, the amount of $SiO_2$ in the composition thereof is 45% by mass to 60% by mass, and the amount of $P_2O_5$ in the composition thereof is 2% by mass to 8% by mass.

The loss on ignition of the glass cloth of the present embodiment is 0.90% by mass to 2.0% by mass.

The use of the glass cloth of the present embodiment in a laminate allows the laminate to have a lower dielectric constant than laminates obtained using glass cloths having a common E glass, D glass, NE glass, or L glass composition.

The amount of $B_2O_3$ in the composition of the glass filaments is 15% by mass to 30% by mass, preferably 20% by mass to 27% by mass, and more preferably 21% by mass to 25% by mass.

When the amount of $B_2O_3$ in the composition is 15% by mass or more, the glass melt viscosity is lowered, which makes drawing of the glass yarn easy and thus results in stable hollow filament quality of the glass cloth. When the amount of $B_2O_3$ in the composition is 30% by mass or less, the moisture absorption resistance is improved when the glass cloth is surface-treated.

The amount of $SiO_2$ in the composition of the glass filaments is 45% by mass to 60% by mass, preferably 47% by mass to 58% by mass, and more preferably 50% by mass to 55% by mass.

When the amount of $SiO_2$ in the composition is 45% by mass or more, the dielectric constant of the resulting laminate is lowered.

When the amount of $SiO_2$ in the composition is 60% by mass or less, the ability for drilling process of the resulting laminate is improved.

The amount of $P_2O_5$ in the composition of the glass filaments is 2% by mass to 8% by mass, preferably 3% by mass to 7% by mass, and more preferably 3% by mass to 6% by mass.

When the amount of $P_2O_5$ in the composition is 2% by mass or more, the glass cloth have a further lowered dielectric constant. When the amount of $P_2O_5$ in the composition is 8% by mass or less, the heat resistance is improved when the glass cloth is surface-treated.

The amounts of the components in the composition of the glass cloth of the present embodiment and the glass filaments constituting the glass cloth can be adjusted depending on the proportions of materials used as sources of the components. The amounts of the components in the composition can be determined by a known analysis technique such as an evaluation technique employing, for example, a combination of fluorescent X-ray analysis and plasma emission spectrometry.

The glass filaments may contain components other than $B_2O_3$, $SiO_2$, and $P_2O_5$. The other components are not particularly limited, and examples thereof include $Al_2O_3$, CaO, and MgO.

The amount of $Al_2O_3$ in the composition of the glass filaments is preferably 10% by mass to 20% by mass and more preferably 13% by mass to 19% by mass. When the amount of $Al_2O_3$ in the composition is within the above range, the yarn productivity tends to be further improved.

The amount of CaO in the composition of the glass filaments is preferably 0% by mass to 8% by mass and more preferably 1% by mass to 8% by mass. When the amount of CaO in the composition is within the above range, the yarn productivity tends to be further improved.

The amount of MgO in the composition of the glass filaments is preferably 0% by mass to 5% by mass and more preferably 1% by mass to 5% by mass. When the amount of MgO in the composition is within the above range, the yarn productivity tends to be further improved.

The composition of the glass filaments in the present embodiment is preferably such that the total amount of $B_2O_3$, $SiO_2$, $P_2O_5$, and the above other components is 100% by mass.

The average filament diameter of the glass filaments is preferably 2.5 μm to 9.0 μm and more preferably 3.5 μm to 7.0 μm. When the average filament diameter of the glass filaments is within the above range, the processability of the resulting laminate in processing by a mechanical drill, a carbon dioxide laser, or a UV-YAG laser tends to be further improved.

The fabric count of the warp yarn and the weft yarn constituting the glass cloth is preferably 10/inch to 120/inch and more preferably 40/inch to 100/inch.

The cloth weight (basis weight) of the glass cloth is preferably 8 g/m$^2$ to 250 g/m$^2$ and more preferably 8 g/m$^2$ to 100 g/m$^2$.

Furthermore, the thickness of the glass cloth untreated with any surface treatment agent is preferably 7 μm to 100 μm.

The weave structure of the glass cloth is not particularly limited, and examples thereof include plain weave, basket weave, satin weave, and twill weave structures. Among these, a plain weave structure is preferred.

The glass cloth of the present embodiment and the glass filaments constituting the glass cloth are treated with a surface treatment agent.

The surface treatment agent is not particularly limited, and a preferred example thereof is a silane coupling agent. The amount of the glass cloth treated with the surface treatment agent can be estimated by an loss on ignition described hereinafter.

The loss on ignition of the glass cloth is 0.90% by mass to 2.0% by mass, preferably 0.95% by mass to 1.8% by mass, and more preferably 0.95% by mass to 1.5% by mass.

When the loss on ignition of the glass cloth is 0.90% by mass or more, the glass cloth has good adhesion to a matrix resin in production of a laminate and the moisture absorption resistance is improved. When the loss on ignition of the glass cloth is 2.0% by mass or less, the degree of resin penetration into the glass cloth is improved.

The "loss on ignition" as described herein can be measured according to the method specified in JIS R 3420. Specifically, first, the glass cloth is placed in a dryer set at 105° C.±5° C. and dried for at least 30 minutes. After the drying, the glass cloth is transferred to a desiccator and left to cool to room temperature. After the cooling, the glass cloth is weighed in the unit of 0.1 mg or less. Next, the glass cloth was heated by a muffle furnace at 625±20° C. or a temperature selected in the range of 500 to 600° C. In the case of a temperature of 625±20° C., the heating is performed for 10 minutes or more, while in the case of a temperature selected in the range of 500 to 600° C., the heating is performed for 1 hour or more. After the heating by the muffle furnace, the glass cloth is transferred to a desiccator and left to cool to room temperature. After the cooling, the glass cloth is weighed in the unit of 0.1 mg or less. The amount of the glass cloth treated with the surface treatment agent is defined by the loss on ignition determined by the above measurement method.

Specifically, in the present embodiment, the loss on ignition can be calculated by the following method.

First, the glass cloth is placed in a dryer set at 110° C. and dried for 60 minutes. After the drying, the glass cloth is transferred to a desiccator and left for 20 minutes to cool to room temperature. After the cooling, the glass cloth is weighed in the unit of 0.1 mg or less. Next, the glass cloth is heated by a muffle furnace at 625° C. for 20 minutes. After the heating by the muffle furnace, the glass cloth is transferred to a desiccator and left for 20 minutes to cool to room temperature. After the cooling, the glass cloth is weighed in the unit of 0.1 mg or less. The amount of the glass cloth treated with the silane coupling agent is defined by the loss on ignition determined by the above measurement method.

Examples of the method for controlling the loss on ignition in the range of 0.90% by mass to 2.0% by mass in the present embodiment include: a method in which the concentration of the surface treatment agent in a surface treatment liquid is adjusted before the non-surface-treated glass cloth is treated with the surface treatment agent; a method in which the loss on ignition is adjusted depending on the time during which the glass cloth is dipped in the surface treatment liquid and/or on the pressure of squeezing by a squeezing roll or the like; a method in which the surface treatment agent is fixed to the glass cloth by heating; and a method in which the glass cloth treated with the treatment agent is washed by means such as a high-pressure water spray. These methods may be used singly or in combinations of two or more.

The silane coupling agent which may be used as the surface treatment agent is not particularly limited. For example, it is preferable to use a silane coupling agent represented by the following formula (1). The use of the silane coupling agent represented by the formula (1) tends to provide a further improvement in moisture absorption resistance. When a silane coupling agent is applied to the glass cloth during the production process of the glass cloth, it is preferable to treat the glass cloth with a treatment liquid containing the silane coupling agent dissolved or dispersed in a solvent (hereinafter, simply referred to as "treatment liquid").

$$X(R)_{3-n}SiY_n \qquad (1)$$

In the formula (1), X is an organic functional group having one or more of at least either of an amino group and an unsaturated double bond group, each Y is independently an alkoxy group, n is an integer of 1 to 3, and each R is independently a group selected from the group consisting of a methyl group, an ethyl group, and a phenyl group.

X is more preferably an organic functional group having three or more of at least either of an amino group and an unsaturated double bond group, and even more preferably an organic functional group having four or more of at least either of an amino group and an unsaturated double bond group. When X is such a functional group, the moisture absorption resistance tends to be further improved.

When X in the formula (1) is an organic functional group having three or more of at least either of an amino group and an unsaturated double bond group, the silane coupling agent may be referred to as a silane coupling agent represented by the formula (2).

When X in the formula (1) is an organic functional group having four or more of at least either of an amino group and an unsaturated double bond group, the silane coupling agent may be referred to as a silane coupling agent represented by the formula (3).

The amino group in the formulae (1) to (3) in the present embodiment may be a primary amine group (—NH$_2$), a secondary amine group (—NH—), or a tertiary amine group (—N<) and may include the primary to tertiary amine groups.

Any alkoxy group can be used as the above alkoxy group. For stable treatment of the glass cloth, an alkoxy group having five or less carbon atoms is preferred.

Specific examples of silane coupling agents which may be used include, but are not limited to, known silane coupling agents such as N-β-(N-vinylbenzylaminoethyl)-γ-aminopropyltrimethoxysilane, hydrochloride thereof, N-β-(N-vinylbenzylaminoethyl)-γ-aminopropylmethyldimethoxysilane, hydrochloride thereof, N-β-(N-di(vinylbenzyl)aminoethyl)-γ-aminopropyltrimethoxysilane, hydrochloride thereof, N-β-(N-di(vinylbenzyl)aminoethyl)-N-γ-(N-vinylbenzyl)-γ-aminopropyltrimethoxysilane, hydrochloride thereof, aminopropyltrimethoxysilane, (aminoethylamino)propyltrimethoxysilane, vinyltrimethoxysilane, methacryloxypropyltrimethoxysilane, and acryloxypropyltrimethoxysilane, which may be used singly or as a mixture thereof.

Water or an organic solvent may be used as the solvent in which the silane coupling agent is dissolved or dispersed. From the viewpoint of safety and global environment protection, it is preferable to use water as a main medium. A method preferably used to obtain a treatment liquid containing water as a main medium is either a method in which the silane coupling agent is directly added to water or a method in which the silane coupling agent is dissolved in a water-soluble organic solvent to prepare an organic solvent solution and then water is added to the organic solvent solution.

In order to improve the water dispersibility and stability of the silane coupling agent in the treatment liquid, it is also possible to use a surfactant.

[Method for Producing Glass Cloth]

The method for producing a glass cloth according to the present embodiment is not particularly limited, and examples thereof include a method comprising a covering step of covering the surface of glass filaments with a silane coupling agent almost completely by use of a treatment liquid containing the silane coupling agent at a concentration of 0.10% by mass to 3.0% by mass, a fixing step of fixing the silane coupling agent to the surface of the glass filaments by heat drying, and an adjustment step of washing off at least a part of the silane coupling agent fixed on the surface of the glass filaments with high-pressure spray water or the like to adjust the amount of the attached silane coupling agent so that the loss on ignition of the glass cloth is in the range of 0.90% by mass to 2.0% by mass.

It is considered that the production method can achieve formation of an almost complete, uniform layer of the silane coupling agent on the entire surface of each of the glass filaments constituting the glass yarn.

Examples of a possible method for applying the treatment liquid to the glass cloth include: (A) a method in which the treatment liquid is held in a bath and the glass cloth is dipped in and passed through the treatment liquid (hereinafter, referred to as "dipping method"); and (B) a method in which the treatment liquid is applied directly to the glass cloth by means such as a roll coater, die coater, or gravure coater. When the application of the treatment liquid is carried out by the dipping method (A), the time during which the glass cloth is dipped in the treatment liquid is preferably 0.5 seconds or more and 1 minute or less.

Examples of means used for heat drying to remove the solvent after the application of the treatment liquid to the glass cloth include known means such as hot air and electromagnetic wave.

The heat drying temperature is preferably 90° C. or more and more preferably 100° C. or more, in order to accomplish sufficient reaction between the silane coupling agent and glass. In order to prevent degradation of the organic functional group of the silane coupling agent, the heat drying temperature is preferably 300° C. or less and more preferably 200° C. or less.

[Prepreg]

A prepreg of the present embodiment comprises the glass cloth described above and a matrix resin impregnating the glass cloth. Thus, a prepreg can be provided which has a low dielectric constant and has an improved insulation reliability due to a decreased formation of hollow filaments and an improved insulation reliability due to an improvement in moisture absorption resistance.

A thermosetting resin or thermoplastic resin can be used as the matrix resin.

Examples of the thermosetting resin include: a) an epoxy resin to be cured through a reaction between an epoxy group-containing compound and a compound having a group reactive with an epoxy group, such as an amino group, a phenol group, an acid anhydride group, a hydrazide group, an isocyanate group, a cyanate group, or a hydroxy group, in the absence of any catalyst or in the presence of an added catalyst having the ability as a reaction catalyst, such as an imidazole compound, a tertiary amine compound, a urea compound, or a phosphorus compound; b) a radical polymerization-based curing resin to be cured through curing of a compound having an allyl group, a methacryl group, or an acryl group by means of a thermal decomposition-based catalyst or photodecomposition-based catalyst as an reaction initiator; c) a maleimide triazine resin to be cured through a reaction between a compound having a cyanate group and a compound having a maleimide group; d) a thermosetting polyimide resin to be cured through a reaction between a maleimide compound and an amine compound; and e) a benzoxazine resin to be cured through crosslinking of a compound having a benzoxazine ring by thermal polymerization.

Examples of the thermoplastic resin include polyphenylene ether, modified polyphenylene ether, polyphenylene sulfide, polysulfone, polyethersulfone, polyarylate, aromatic polyamide, polyether ether ketone, thermoplastic polyimide, insoluble polyimide, polyamideimide, and fluorine resins. The thermosetting resin and the thermoplastic resin may be used in combination.

[Printed Wiring Board]

A printed wiring board of the present embodiment is produced using the prepreg described above. Thus, a printed wiring board having a low dielectric constant and high insulation reliability can be provided.

EXAMPLES

Next, the present invention will be described in more detail by means of Examples and Comparative Examples. The present invention is not limited in any respect by Examples given below.

In all of Examples and Comparative Examples, the loss on ignition was adjusted by: appropriately adjusting the concentration of the surface treatment agent in the treatment liquid to 0.10% by mass to 3.0% by mass; appropriately adjusting the time during which the glass cloth was dipped in the surface treatment liquid and/or the pressure of squeezing by a squeezing roll or the like; carrying out the fixing step of fixing the silane coupling agent to the surface of glass filaments by heat drying; and washing off the silane coupling agent fixed on the surface of the glass filaments by spreading with high-pressure water.

Example 1

A glass cloth (Style 1078: average filament diameter: 5 µm, fabric count of warp yarn: 54/inch, fabric count of weft yarn: 54/inch, thickness: 46 µm) containing 16% by mass of $B_2O_3$, 59% by mass of $SiO_2$, and 4% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 0.95% by mass.

Example 2

A glass cloth (Style 1078: average filament diameter: 5 µm, fabric count of warp yarn: 54/inch, fabric count of weft yarn: 54/inch, thickness: 46 µm) containing 25% by mass of $B_2O_3$, 52% by mass of $SiO_2$, and 4% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 0.96% by mass.

Example 3

A glass cloth (Style 1078: average filament diameter: 5 µm, fabric count of warp yarn: 54/inch, fabric count of weft yarn: 54/inch, thickness: 46 µm) containing 29% by mass of $B_2O_3$, 50% by mass of $SiO_2$, and 4% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 0.99% by mass.

Example 4

A glass cloth (Style 1078: average filament diameter: 5 μm, fabric count of warp yarn: 54/inch, fabric count of weft yarn: 54/inch, thickness: 46 μm) containing 25% by mass of $B_2O_3$, 52% by mass of $SiO_2$, and 7% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 1.3% by mass.

Example 5

A glass cloth (Style 1078: average filament diameter: 5 μm, fabric count of warp yarn: 54/inch, fabric count of weft yarn: 54/inch, thickness: 46 μm) containing 25% by mass of $B_2O_3$, 52% by mass of $SiO_2$, and 4% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 1.3% by mass.

Example 6

A glass cloth (Style 1078: average filament diameter: 5 μm, fabric count of warp yarn: 54/inch, fabric count of weft yarn: 54/inch, thickness: 46 μm) containing 25% by mass of $B_2O_3$, 52% by mass of $SiO_2$, and 4% by mass of $P_2O_5$ was dipped in a treatment liquid containing (aminopropyl)triethoxysilane (Z 6011, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 0.91% by mass.

Example 7

A glass cloth (Style 1078: average filament diameter: 5 μm, fabric count of warp yarn: 54/inch, fabric count of weft yarn: 54/inch, thickness: 46 μm) containing 25% by mass of $B_2O_3$, 52% by mass of $SiO_2$, and 4% by mass of $P_2O_5$ was dipped in a treatment liquid containing (aminoethylamino)propyltrimethoxysilane (Z 6020, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 0.92% by mass.

Comparative Example 1

A glass cloth (Style 1078: average filament diameter: 5 μm, fabric count of warp yarn: 54/inch, fabric count of weft yarn: 54/inch, thickness: 46 μm) containing 14% by mass of $B_2O_3$, 61% by mass of $SiO_2$, and 4% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 0.90% by mass.

Comparative Example 2

A glass cloth (Style 1078: average filament diameter: 5 μm, fabric count of warp yarn: 54/inch, fabric count of weft yarn: 54/inch, thickness: 46 μm) containing 31% by mass of $B_2O_3$, 44% by mass of $SiO_2$, and 4% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 0.93% by mass.

Comparative Example 3

A glass cloth (Style 1078: average filament diameter: 5 μm, fabric count of warp yarn: 54/inch, fabric count of weft yarn: 54/inch, thickness: 46 μm) containing 25% by mass of $B_2O_3$, 52% by mass of $SiO_2$, and 4% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 0.80% by mass.

Comparative Example 4

A glass cloth (Style 1078: average filament diameter: 5 μm, fabric count of warp yarn: 54/inch, fabric count of weft yarn: 54/inch, thickness: 46 μm) containing 25% by mass of $B_2O_3$, 52% by mass of $SiO_2$, and 4% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 2.1% by mass.

Comparative Example 5

A glass cloth (Style 1078: average filament diameter: 5 μm, fabric count of warp yarn: 54/inch, fabric count of weft yarn: 54/inch, thickness: 46 μm) containing 25% by mass of $B_2O_3$, 52% by mass of $SiO_2$, and 9% by mass of $P_2O_5$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 1.3% by mass.

Comparative Example 6

An E-glass cloth (Style 1078: average filament diameter: 5 μm, fabric count of warp yarn: 54/inch, fabric count of weft yarn: 54/inch, thickness: 46 μm) containing 7% by mass of $B_2O_3$ and 54% by mass of $SiO_2$ was dipped in a treatment liquid containing N-β-(N-vinylbenzylaminoethyl)-γ-aminopropyltrimethoxysilane hydrochloride (Z 6032, available from Dow Corning Toray Co., Ltd.) dispersed in water, and the glass cloth was then dried by heating. Next, spreading with high-pressure water was performed by spraying, followed by heat drying to give a glass cloth. The loss on ignition of the silane coupling agent was 0.24% by mass.

<Evaluation Method of Loss on Ignition>

The loss on ignition was measured according to the method specified in JIS R 3420. Specifically, the glass cloth was placed in a dryer set at 110° C. and dried for 60 minutes. After the drying, the glass cloth was transferred to a desiccator and left for 20 minutes to cool to room temperature. After the cooling, the glass cloth was weighed in the unit of 0.1 mg or less. Next, the glass cloth was heated by a muffle furnace at 625° C. for 20 minutes. After the heating by the muffle furnace, the glass cloth was transferred to a desiccator and left for 20 minutes to cool to room temperature. After the cooling, the glass cloth was weighed in the unit of 0.1 mg or less. The weight change before and after the heating by the muffle furnace was measured, and the loss on ignition was calculated as the amount of the attached treatment agent from the weight change.

<Method for Producing Laminate>

Each of the glass cloths obtained in Examples and Comparative Examples described above was impregnated with an epoxy resin varnish (a mixture of 40 parts by mass of low-brominated bisphenol A type epoxy resin, 10 parts by mass of o-cresol-based novolac epoxy resin, 50 parts by mass of dimethylformamide, 1 part by mass of dicyandiamide, and 0.1 parts by mass of 2-ethyl-4-methylimidazole) and was dried at 160° C. for 2 minutes to obtain a prepreg. Such prepregs were stacked, and 12-μm-thick copper foils were placed on the top and bottom of the stack of prepregs. The stack of prepregs and copper foils was subjected to heat and pressure at 175° C. and 40 kg/cm² for 60 minutes to obtain a laminate.

<Evaluation Method of Dielectric Constant of Laminate>

A 1-mm-thick laminate was produced as described above, and the copper foils were removed to obtain a sample for dielectric constant evaluation. The dielectric constant of the obtained sample at a frequency of 1 GHz was measured using an impedance analyzer (available from Agilent Technologies, Inc.).

<Evaluation Method of Water Absorption Rate and Heat Resistance of Laminate>

A 0.4-mm-thick laminate was produced as described above, and the copper foils were removed to obtain a sample for evaluation of water absorption properties. The obtained sample was heated at 120° C. for 60 minutes, left to cool to room temperature in a desiccator, and then weighed with an electronic balance. Next, a pressure cooker was used to cause the sample to absorb water under heating at 121° C. for 500 hours, after which the sample was left to cool to room temperature in water. Water was then removed from the surface of the sample, and the sample was weighed with an electronic balance. The water absorption rate of the laminate was determined from the weight change before and after the water absorption under heating. Further, the laminate having absorbed water was dipped in a solder bath at 288° C. for 20 seconds, and the laminate was checked for cracks by visual inspection. In Table 1, the heat resistance was rated "○" for the case where no crack was found, while the heat resistance was rated "X" for the case where a crack was found. The fact that no crack was found means that the laminate had high heat resistance.

<Evaluation Method of Interlayer Adhesion of Laminate>

A 0.4-mm-thick laminate was produced as described above, and Autograph was used to cause delamination at the center of the thickness of the laminate and determine an adhesive strength (kN/m).

<Evaluation Method of Insulation Reliability of Laminate>

A 0.4-mm-thick laminate was produced as described above, and a wiring pattern having through holes arranged at intervals of 0.15 mm was made on each of the copper foils forming the two outermost layers of the laminate. Thus, a sample for insulation reliability evaluation was obtained. The obtained sample was subjected to a voltage of 10 V in an atmosphere with a temperature of 120° C. and a humidity of 85% RH to measure the change in resistance value. When the resistance decreased to less than 1 MΩ within 500 hours from the start of the test, insulation failure was counted as having occurred. The same measurement was conducted for ten samples, and the percentage of samples for which insulation failure did not occur was calculated.

The results of evaluation of the dielectric constant, water absorption rate, heat resistance, interlayer adhesion, and insulation reliability of the laminates according to Examples 1 to 7 and Comparative Examples 1 to 6 are summarized in Table 1.

TABLE 1

| | $B_2O_3$ | $SiO_2$ | $P_2O_5$ | Loss on ignition % by mass | dielectric constant | Water absorption rate % by mass | Heat Resistance | Interlayer adhesion kN/m | Insulation reliability % |
|---|---|---|---|---|---|---|---|---|---|
| Example 1 | 16 | 59 | 4 | 0.95 | 4.0 | 1.1 | ○ | 2.0 | 90 |
| Example 2 | 25 | 52 | 4 | 0.96 | 4.0 | 1.3 | ○ | 1.9 | 100 |
| Example 3 | 29 | 50 | 4 | 0.99 | 3.9 | 1.4 | ○ | 1.7 | 90 |
| Example 4 | 25 | 52 | 7 | 1.3 | 3.9 | 1.4 | ○ | 1.7 | 90 |
| Example 5 | 25 | 52 | 4 | 1.3 | 4.0 | 1.2 | ○ | 2.0 | 100 |
| Example 6 | 25 | 52 | 4 | 0.91 | 4.0 | 1.5 | ○ | 1.8 | 90 |
| Example 7 | 25 | 52 | 4 | 0.92 | 4.0 | 1.4 | ○ | 1.9 | 90 |
| Comparative Example 1 | 14 | 61 | 4 | 0.90 | 3.9 | 1.1 | ○ | 2.0 | 0 |

TABLE 1-continued

| | $B_2O_3$ | $SiO_2$ | $P_2O_5$ | Loss on ignition % by mass | dielectric constant | Water absorption rate % by mass | Heat Resistance | Interlayer adhesion kN/m | Insulation reliability % |
|---|---|---|---|---|---|---|---|---|---|
| Comparative Example 2 | 31 | 44 | 4 | 0.93 | 3.9 | 2.0 | × | 1.5 | 0 |
| Comparative Example 3 | 25 | 52 | 4 | 0.80 | 4.0 | 2.0 | × | 1.3 | 0 |
| Comparative Example 4 | 25 | 52 | 4 | 2.1 | 4.0 | 1.5 | ○ | 1.9 | 0 |
| Comparative Example 5 | 25 | 52 | 9 | 1.3 | 3.9 | 2.1 | × | 1.2 | 0 |
| Comparative Example 6 | 7 | 54 | 0 | 0.24 | 5.4 | 1.1 | ○ | 2.0 | 100 |

The glass cloths of Examples 1 to 7 were demonstrated to have a low dielectric constant and be very superior in terms of water absorption rate, heat resistance, interlayer adhesion, and insulation reliability.

The present application is based on Japanese Patent Application (Japanese Patent Application No. 2017-210984) filed on Oct. 31, 2017, the contents of which are herein incorporated by reference.

INDUSTRIAL APPLICABILITY

The glass cloth of the present invention is industrially applicable as a base material for printed wiring boards for use in the electronic and electrical fields.

The invention claimed is:

1. A glass cloth comprising a glass yarn woven together, the glass yarn comprising multiple glass filaments, wherein an amount of $B_2O_3$ in a composition of the glass filaments is 15% by mass to 30% by mass, an amount of $SiO_2$ in the composition thereof is 45% by mass to 60% by mass, and an amount of $P_2O_5$ in the composition thereof is 2% by mass to 8% by mass, the glass cloth is treated with a silane coupling agent, and loss on ignition (LOI) of the glass cloth, which defines an amount of the silane coupling agent on the glass cloth, is 0.90% by mass to 2.0% by mass.

2. The glass cloth according to claim 1, wherein the silane coupling agent is represented by following formula (1):

$$X(R)_{3-n}SiY_n \quad (1),$$

wherein X is an organic functional group having one or more of at least either of an amino group and an unsaturated double bond group, each Y is independently an alkoxy group, n is an integer of 1 to 3, and each R is independently a group selected from the group consisting of a methyl group, an ethyl group, and a phenyl group.

3. The glass cloth according to claim 1, wherein the silane coupling agent is represented by the following formula (2):

$$X(R)_{3-n}SiY_n \quad (2),$$

wherein X is an organic functional group having three or more of at least either of an amino group and an unsaturated double bond group, each Y is independently an alkoxy group, n is an integer of 1 to 3, and each R is independently a group selected from the group consisting of a methyl group, an ethyl group, and a phenyl group.

4. The glass cloth according to claim 1, wherein the silane coupling agent is represented by the following formula (3):

$$X(R)_{3-n}SiY_n \quad (3),$$

wherein X is an organic functional group having four or more of at least either of an amino group and an unsaturated double bond group, each Y is independently an alkoxy group, n is an integer of 1 to 3, and each R is independently a group selected from the group consisting of a methyl group, an ethyl group, and a phenyl group.

5. A prepreg comprising the glass cloth according to claim 1 and a matrix resin impregnating the glass cloth.

6. A printed wiring board produced using the prepreg according to claim 5.

* * * * *